United States Patent [19]
Umezawa

[11] Patent Number: 6,023,413
[45] Date of Patent: *Feb. 8, 2000

[54] COOLING STRUCTURE FOR MULTI-CHIP MODULE

[75] Inventor: Kazuhiko Umezawa, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/017,875

[22] Filed: Feb. 3, 1998

[30] Foreign Application Priority Data

Feb. 3, 1997 [JP] Japan .................................... 9-020574

[51] Int. Cl.⁷ .................................................... H05K 7/20
[52] U.S. Cl. ........................................... 361/697; 165/80.3
[58] Field of Search .................................. 415/177, 178, 415/213.1, 214.1; 454/184; 165/80.3, 185, 121–126; 257/722; 174/16.3; 361/687, 690, 694, 695, 697, 703–705, 709–711, 717–719, 722

[56] References Cited

U.S. PATENT DOCUMENTS

| | | |
|---|---|---|
| 5,063,476 | 11/1991 | Hamada . |
| 5,353,863 | 10/1994 | Yu . |
| 5,689,404 | 11/1997 | Katsui . |
| 5,785,116 | 7/1998 | Wagner . |
| 5,794,685 | 8/1998 | Dean ........................................ 361/697 |
| 5,864,464 | 1/1999 | Lin . |
| 5,932,925 | 8/1999 | McIntyre . |
| 5,953,208 | 9/1999 | Katsui . |

FOREIGN PATENT DOCUMENTS

| | | |
|---|---|---|
| 55-165657 | 12/1980 | Japan . |
| 61-36961 | 2/1986 | Japan . |
| 62-170644 | 10/1987 | Japan . |
| 63-200549 | 8/1988 | Japan . |
| 217659 | 1/1990 | Japan . |
| 2224361 | 9/1990 | Japan . |
| 316314 | 4/1991 | Japan . |
| 4287349 | 10/1992 | Japan . |
| 5243439 | 9/1993 | Japan . |
| 7130924 | 5/1995 | Japan . |
| 7176654 | 7/1995 | Japan . |
| 7183434 | 7/1995 | Japan . |
| 832262 | 2/1996 | Japan . |
| 8-255855 | 10/1996 | Japan . |
| 8-316380 | 11/1996 | Japan . |

OTHER PUBLICATIONS

Nikkei Byte, No. 155, pp. 150–151, Sep. 1996 w/English description.

*Primary Examiner*—Gerald Tolin
*Attorney, Agent, or Firm*—Sughrue, Mion, Zinn, Macpeak & Seas, PLLC

[57] ABSTRACT

A cooling structure for a multi-chip module includes a multi-chip module, a fan-builtin heat sink, a cooling fan, and openings. In the multi-chip module, a plurality of chips are mounted on a wiring board. The heat sink has a bottom plate and is arranged above the multi-chip module. The cooling fan is arranged in an upper portion of the heat sink to cool the multi-chip module. The openings are formed in a bottom plate of the heat sink to supply air from the cooling fan to the multi-chip module.

17 Claims, 5 Drawing Sheets

COOLING STRUCTURE FOR MULTI-CHIP MODULE

BACKGROUND OF THE INVENTION

The present invention relates to a cooling structure for a multi-chip module and, more particularly, to a cooling structure for a multi-chip module on which a microprocessor and cache memory devices having a large power consumption are mounted.

Conventionally, in a multi-chip module in which a microprocessor and a plurality of cache memory devices are mounted on a wiring board, the power consumption of the microprocessor and cache memory devices is comparatively small. Therefore, a general heat sink having a plate or pin type fins is attached to only the microprocessor, and is forcibly cooled by a cooling fan arranged in an equipment that uses the multi-chip module.

As the semiconductor integrated circuit technology develops, the integration degree and operation speed of the microprocessor increase, and the power consumption also increases. As a result, if only forced cooling achieved by attaching the general heat sink is provided, sufficiently high cooling performance cannot be obtained.

In order to solve this problem, NIKKEI BYTE, No. 155, pp. 150–151, September 1996 discloses a fan-builtin heat sink in which a compact cooling fan is directly attached to the heat sink to cool the heat sink by blowing air to its bottom plate.

As shown in FIG. 5, a conventional cooling structure for a multi-chip module is constituted by a multi-chip module 18 and a fan-builtin heat sink 22. The multi-chip module 18 is constituted by a wiring board 19, and a microprocessor 20 and a plurality of cache memory devices 21 that are mounted on the wiring board 19. The fan-builtin heat sink 22 is attached to the upper portion of the microprocessor 20 mounted on the multi-chip module 18.

The fan-builtin heat sink 22 is constituted by a heat sink 23 and a cooling fan 24. The flow of air generated upon rotation of the cooling fan 24 collides against the bottom surface of the heat sink 23 and flows out to the portion around the heat sink 23. Heat generated by the microprocessor 20 and transmitted to the heat sink 23 is cooled by the flow of air generated by the cooling fan 24. Heat generated by the cache memory devices 21 is cooled by natural convection, or is forcibly cooled by a cooling fan (not shown) separately arranged in the equipment that uses the multi-chip module 18.

In the conventional cooling structure for the multi-chip module described above, as the power consumption of the microprocessor 20 increases, the fan-builtin heat sink 22 having a size to cover the cache memory devices 21 on the multi-chip module 18 becomes necessary. As a result, the flow of air on the cache memory devices 21 is blocked to degrade heat transfer from the cache memory devices 21. When the operating speed of the microprocessor 20 is to be increased, the operating speed of the cache memory devices 21 must also be increased. Accordingly, as the power consumption of the microprocessor 20 increases, the power consumption of the cache memory devices 21 also increases. If the size of the fan-builtin heat sink 22 is increased, as described above, the cooling properties of the cache memory devices 21 are further degraded.

In order to solve this problem, if the wind velocity in the equipment is increased by the cooling fan arranged in the equipment that uses the multi-chip module 18, thus cooling the cache memory devices 21, the noise of the equipment is undesirably increased by the cooling fan. The conventional technique cannot thus cope with an increase in power consumption of the microprocessor 20 and cache memory devices 21.

SUMMARY OF THE INVENTION

It is an object of the present invention to provide a cooling structure for a multi-chip module which can efficiently cool the cache memory devices in accordance with an increase in power consumption of the microprocessor and cache memory devices.

In order to achieve the above object, according to the present invention, there is provided a cooling structure for a multi-chip module, comprising a multi-chip module in which a plurality of chips are mounted on a wiring board, a heat sink having a bottom plate and arranged above the multi-chip module, a cooling fan arranged in an upper portion of the heat sink to cool the multi-chip module, and openings formed in a bottom plate of the heat sink to supply air from the cooling fan to the multi-chip module.

DESCRIPTION OF THE PREFERRED EMBODIMENTS

The present invention will be described in detail with reference to the accompanying drawings.

Figure 1:
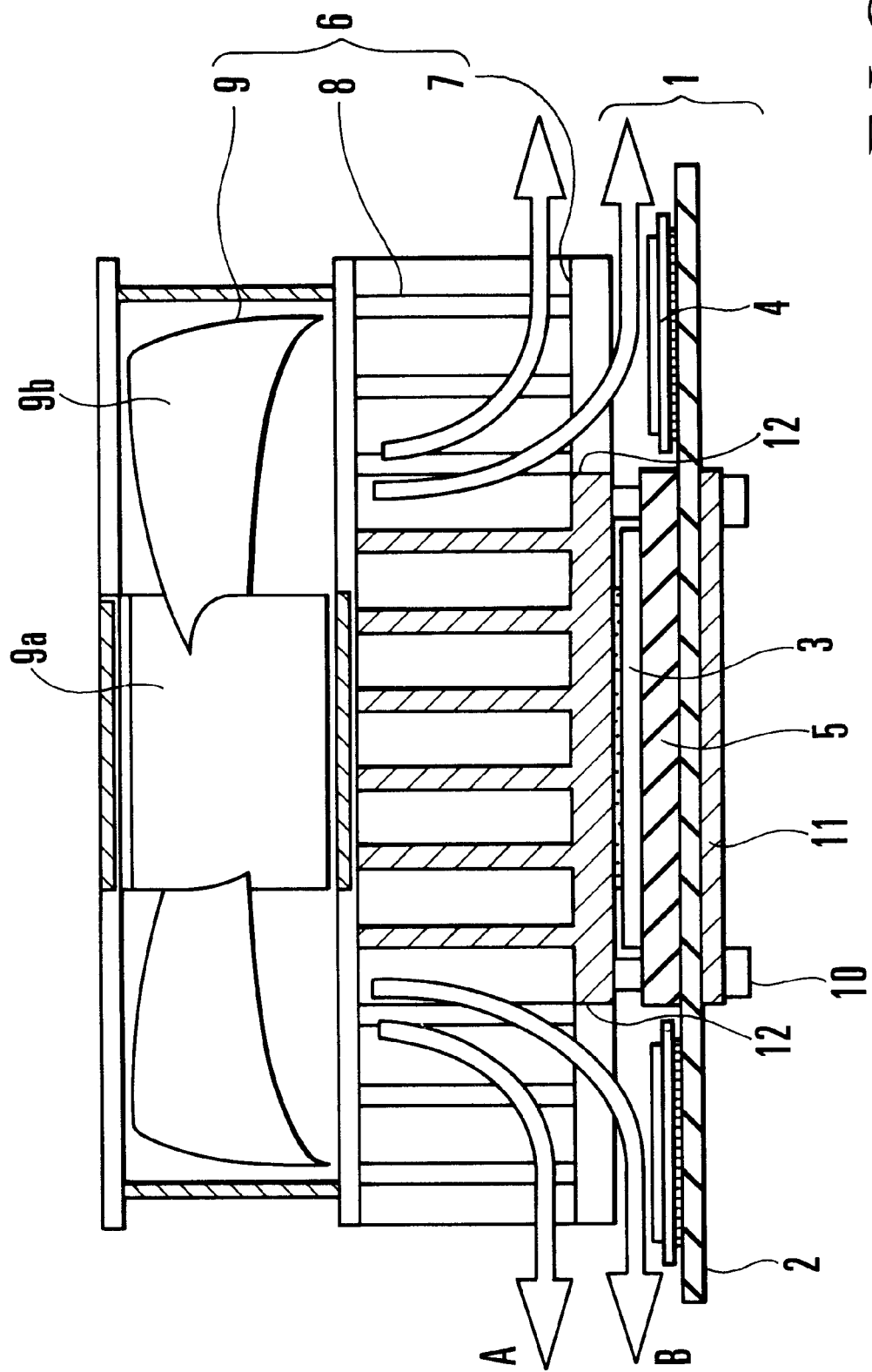
FIG. 1 is a sectional view of a multi-chip module according to the first embodiment of the present invention.

FIG. 1 shows a cooling structure for a multi-chip module according to the first embodiment of the present invention. Referring to FIG. 1, the cooling structure for the multi-chip module of this embodiment is constituted by a multi-chip module 1 and a fan-builtin heat sink 6 formed on the multi-chip module 1 and having openings 12.

The multi-chip module 1 is constituted by a wiring board 2, a microprocessor 3 mounted on the wiring board 2, and at least one cache memory device 4 mounted on the wiring board 2 and arranged around the microprocessor 3.

The microprocessor 3 is accommodated in a case (package) called a pin grid array in which input/output pins (not shown) are arranged on a ceramic or plastic board in a matrix. The microprocessor 3 is attached to the wiring board 2 with a socket 5. The socket 5 electrically connects the input/output pins of the case that accommodates the microprocessor 3 to the wiring board 2 and facilitates mounting and removal of the microprocessor 3.

Figure 2:
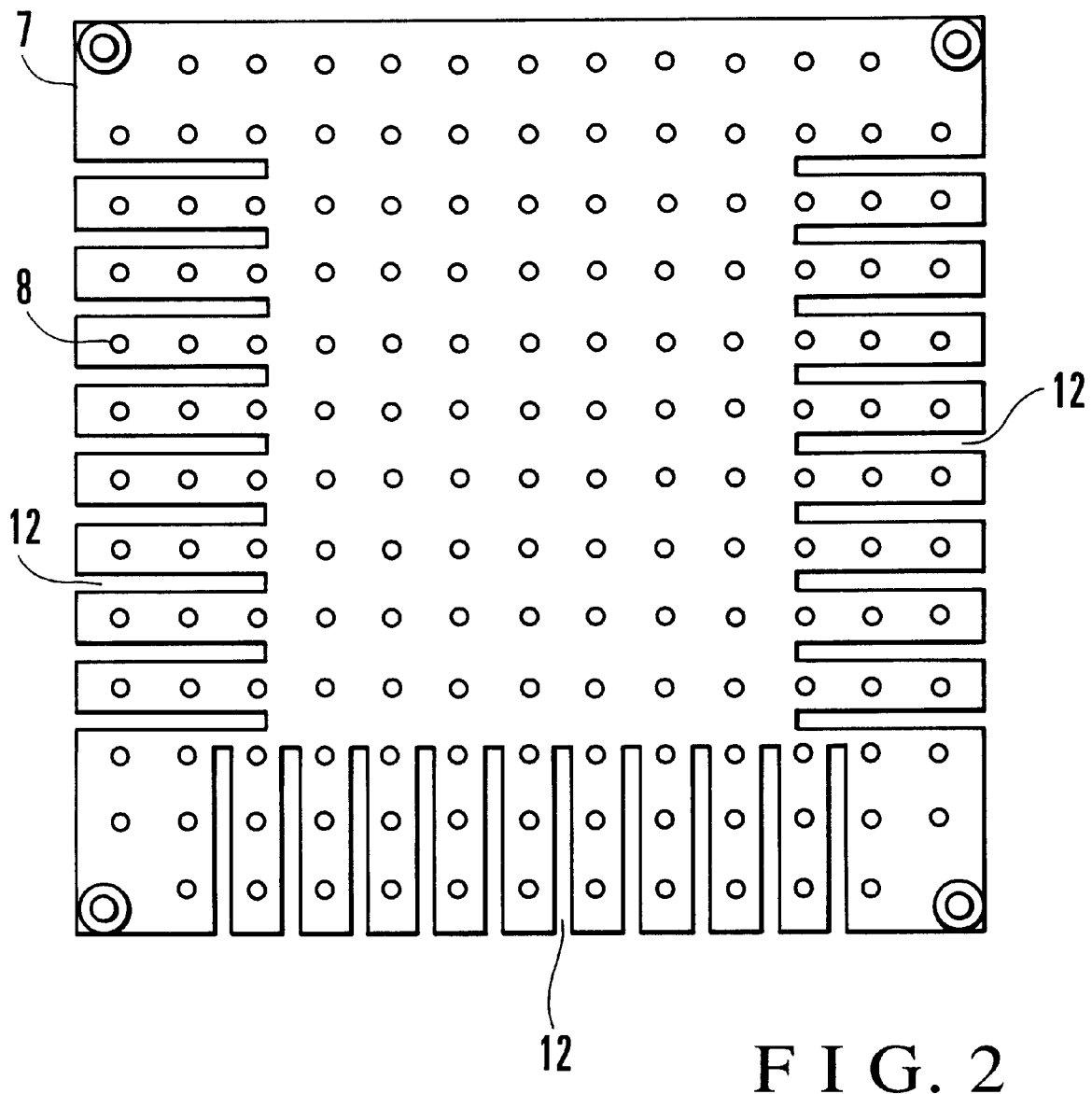
FIG. 2 is a plan view of the bottom plate shown in FIG. 1.

The fan-builtin heat sink 6 is constituted by a square bottom plate 7, a plurality of pin type fins 8, and a cooling fan 9. The bottom plate 7 is thermally connected to the microprocessor 3. The pin type fins 8 are arranged on the bottom plate 7 in a matrix. The cooling fan 9 is arranged to cover the portion above the fins 8. The fan-builtin heat sink 6 is larger than the outer shape of the microprocessor 3 and extends to cover at least the upper portion of the cache memory device 4. As shown in FIG. 2, the plurality of slit-like openings 12 each having a predetermined length are formed in the peripheral portion of the bottom plate 7 of the fan-builtin heat sink 6 to oppose the cache memory device 4.

The bottom plate 7 and fins 8 of the fan-builtin heat sink 6 are integrally molded with a mold by using aluminum as the material. The openings 12 are formed during molding of the bottom plate 7 by using the mold.

The cooling fan 9 is constituted by a shaft portion 9a and vanes 9b. The total diameter of the vanes 9b including the shaft portion 9a is substantially the same as the length of one side of the bottom plate 7. Namely, the cooling fan 9 is formed to blow air to the entire surface of the bottom plate 7. A motor (not shown) is arranged in the shaft portion 9a of the cooling fan 9. The cooling fan 9 rotates as it is driven by this motor, and generates flow of air.

How to attach the fan-builtin heat sink 6 to the multi-chip module 1 will be described. Referring to FIG. 1, the attaching structure of the fan-builtin heat sink 6 is constituted by screws 10, a press plate 11, and female threads formed in the bottom plate 7.

The screws 10 extend through the press plate 11, the wiring board 2, and the socket 5 to threadably engage with the female threads (not shown) formed in the bottom plate 7 of the fan-builtin heat sink 6. This fixes the fan-builtin heat sink 6 to the multi-chip module 1 such that the lower surface of the bottom plate 7 comes into contact with the upper surface of the microprocessor 3. An adhering member or spacing member having a high thermal conductivity may be interposed between the upper surface of the microprocessor 3 and the lower surface of the bottom plate 7. The press plate 11 is arranged to prevent the wiring board 2 from being warped by the fastening force of the screws 10 when the fan-builtin heat sink 6 is attached to the multi-chip module 1.

The cooling operation of the multi-chip module having the arrangement as described above will be described. When the cooling fan 9 is rotated, a flow of air toward the multi-chip module 1 is generated in the fan-builtin heat sink 6, as indicated by arrows A and B. Most of the flow of air from the cooling fan 9 collides against the bottom plate 7 to be switched, as indicated by the arrow A, and passes through the fins 8 and flows to the outside from the side surface of the fan-builtin heat sink 6.

As indicated by the arrow B, the remaining flow of air passes through the openings 12 of the bottom plate 7 to collide against the cache memory device 4, and passes through the gap between the wiring board 2 and fan-builtin heat sink 6 to flow out to the portion around the multi-chip module 1.

Heat generated by the microprocessor 3 and transmitted to the bottom plate 7 and the fins 8 is cooled by air (arrow A) that collides against the bottom plate 7, passes through the fins 8, and flows to the outside from the side surface of the fan-builtin heat sink 6. Meanwhile, heat generated by the cache memory device 4 is cooled by air (arrow B) that passes through the openings 12 of the bottom plate 7, directly collides against the cache memory device 4, and flows out.

According to the embodiment described above, since the openings 12 are formed in the bottom plate 7 of the fan-builtin heat sink 6 to correspond to the cache memory device 4, the cache memory device 4 can also be cooled by part of the flow of air generated by the cooling fan 9. As a result, in accordance with an increase in power consumption of the microprocessor 3, even if the fan-builtin heat sink 6 becomes large to cover the cache memory device 4 on the multi-chip module 1, the cache memory device 4 can be cooled efficiently.

The second embodiment of the present invention will be described with reference to FIGS. 3 and 4.

The characteristic feature of the second embodiment resides in that a fan-builtin heat sink is attached to a wiring board with attaching metal fixtures and springs. Except for this, the arrangement of the second embodiment is similar to that of the first embodiment. Therefore, the portions that are identical to those in the first embodiment are denoted by the same reference numerals, and a detailed description thereof will be omitted.

Figure 3:
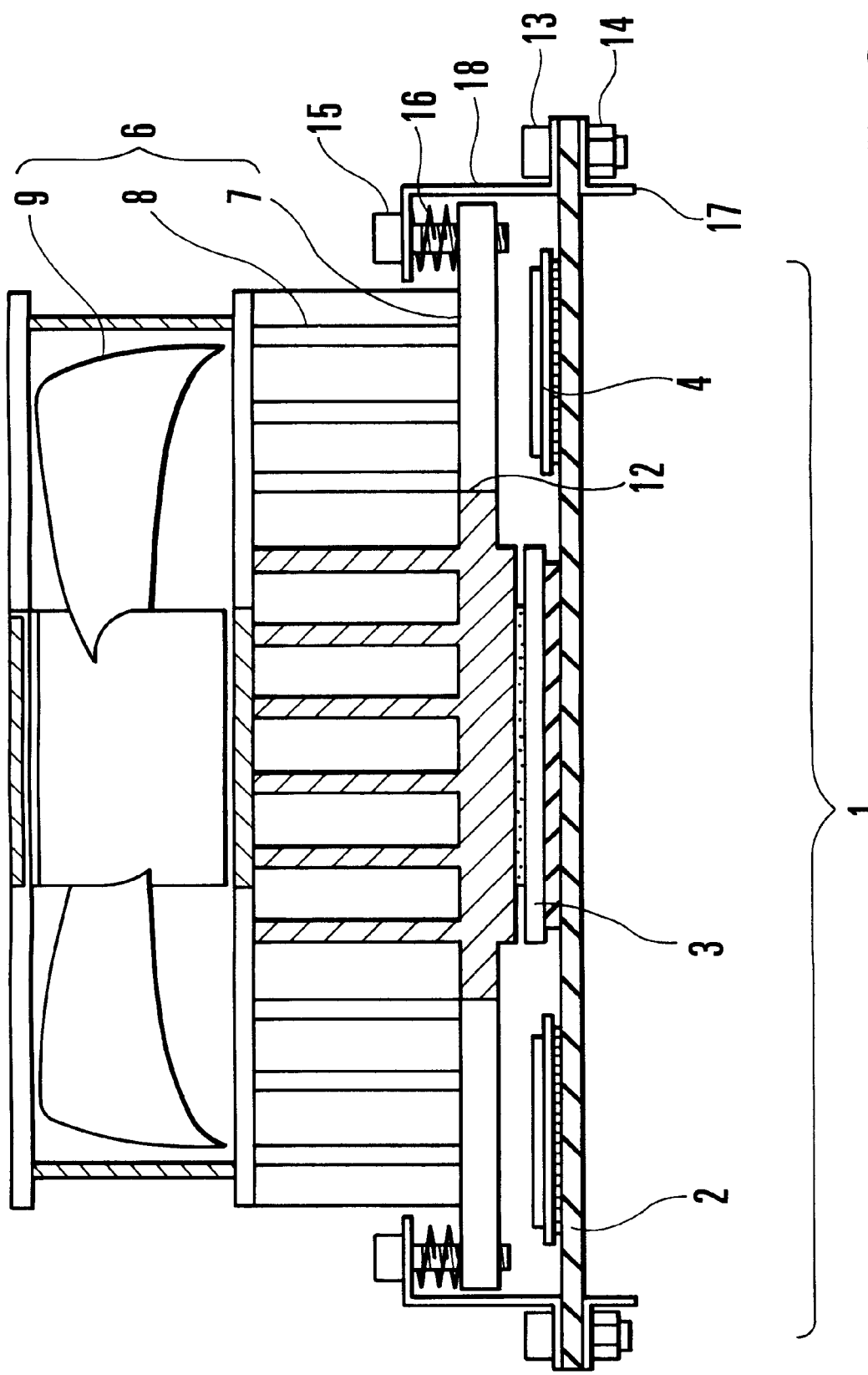
FIG. 3 is a sectional view of a multi-chip module according to the second embodiment of the present invention.
Figure 4:
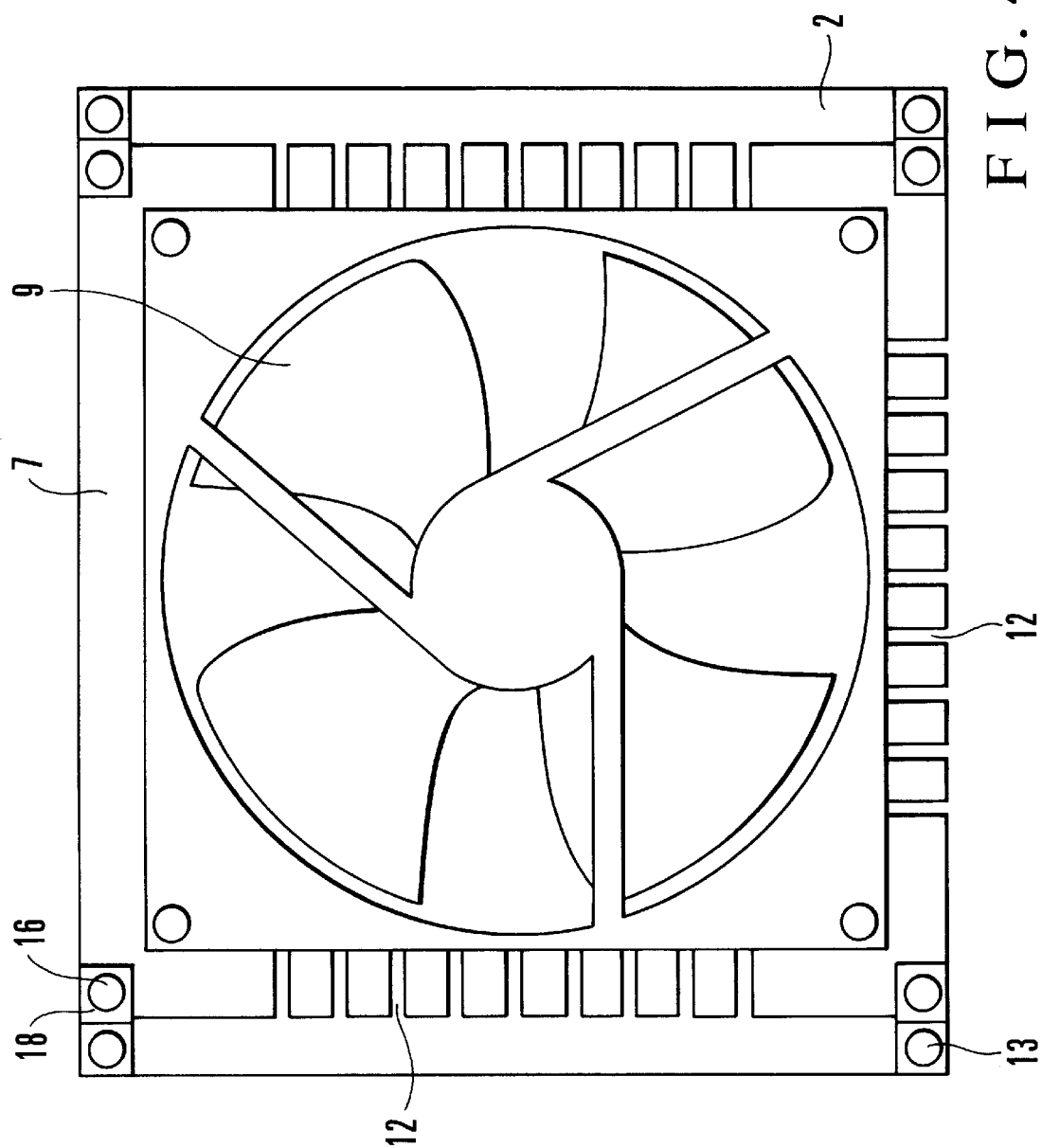
FIG. 4 is a plan view of the multi-chip module shown in FIG. 3.
Figure 5:
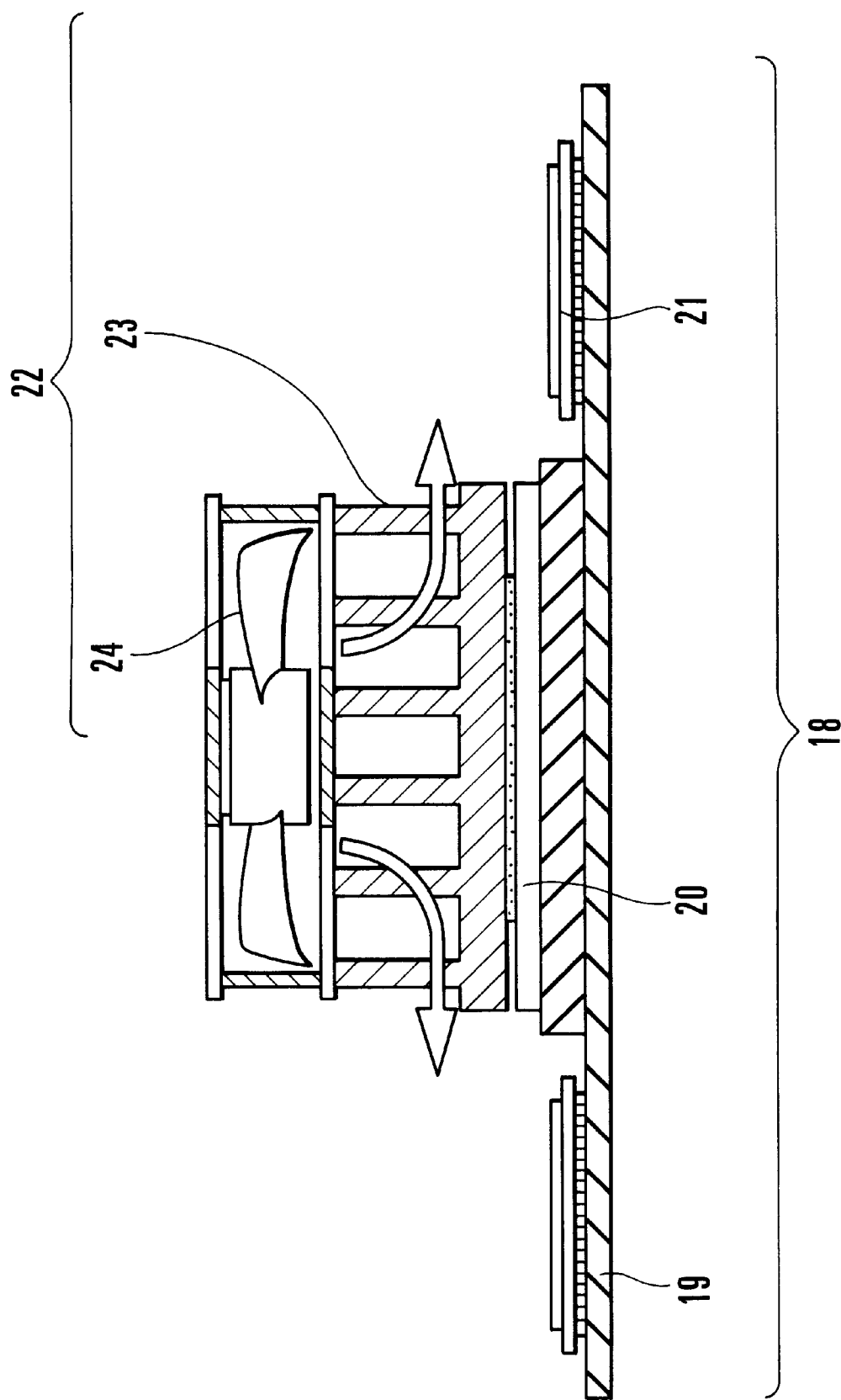
FIG. 5 is a sectional view of a conventional multi-chip module.

Referring to FIG. 3, a microprocessor 3 is bonded to a wiring board 2 not by using a socket but by directly soldering the pins of a case (package) to the wiring board 2. For this reason, a fan-builtin heat sink 6 cannot be fixed to the wiring board 2 of a multi-chip module 1 through a socket. Hence, as shown in FIG. 4, four attaching metal fixtures 18 are attached to the four corners of the wiring board 2 with screws 13 and nuts 14.

Each attaching metal fixture 18 is formed into a Z-shape, and its one end is fixed to the wiring board 2. The other end of the attaching metal fixture 18 is formed with an attaching hole (not shown), and is arranged above a bottom plate 7 of the fan-builtin heat sink 6.

The bottom plate 7 of the fan-builtin heat sink 6 which has openings 12 extends in four directions from its portions where fins 8 are formed, and female threads (not shown) are formed in the four corners of the bottom plate 7 to extend through it. Attaching screws 15 are inserted in the attaching holes of the attaching metal fixtures 18, and extend through coiled compression springs 16 to threadably engage with the female threads of the bottom plate 7, thereby attaching the fan-builtin heat sink 6 to the multi-chip module 1 with the attaching metal fixtures 18.

Stiffeners 17 are arranged to prevent the wiring board 2 from being warped by the fastening force of the attaching screws 15 and the force of the compression springs 16 when the fan-builtin heat sink 6 is attached to the multi-chip module 1.

According to the embodiment described above, since the attaching metal fixtures 18 are attached to the peripheral portion of the wiring board 2 of the multi-chip module 1, they do not substantially influence the accommodating properties and the degree of design freedom of the pattern wiring of the wiring board 2. Since the flexing amount of the compression springs 16 can be changed by fastening the attaching screws 15, the force for urging the fan-builtin heat sink 6 against the microprocessor 3 can be adjusted.

In the embodiments described above, the slit-like openings 12 are formed in the bottom plate 7 of the fan-builtin heat sink 6. However, the present invention is not limited to this, and openings having various shapes, including notches, can be formed. For example, one or more round or elongated hole-like openings may be formed in the bottom plate 7 to correspond to the position of each slit-like opening 12. More specifically, a plurality of small round or elongated holes are formed in a row to correspond to the shape of each slit-like opening 12, and rows each formed in this manner are arranged at the same interval as that of the slit-like openings 12. Since these holes can be formed by drilling or the like even after the fan-builtin heat sink 6 is molded, the manufacture is further facilitated.

In the above embodiments, one microprocessor 3 is arranged in the multi-chip module 1. However, the present invention can also be applied to a case wherein a plurality of microprocessors are arranged in the multi-chip module. At this time, one fan-builtin heat sink may be arranged for each of the plurality of microprocessors, or one fan-builtin heat sink may be arranged for the plurality of microprocessors.

In the above embodiments, the bottom plate 7 and fins 8 of the fan-builtin heat sink 6 are integrally molded with a mold. However, the bottom plate 7 and fins 8 may be manufactured separately, and the fins 8 may be provided to extend vertically on the bottom plate 7. The openings 12 may not be formed during molding, but may be formed by machining the bottom plate 7.

In the above embodiments, the microprocessor 3 is accommodated in the pin grid array. However, the present invention is not limited to this, and a microprocessor may be accommodated in a case (package) other than a pin grid array, i.e., a ball grid array (BGA) or a chip size package (CSP).

As has been apparent from the above description, according to the present invention, the flow of air generated by rotation of the cooling fan is divided into a flow for the microprocessor and a flow for the cache memory devices. Therefore, even if the size of the fan-builtin heat sink increases in accordance with an increase in power consumption of the microprocessor, so that the fan-builtin heat sink covers the cache memory device, the cache memory device can be cooled efficiently.

Since the flexing amount of the springs is changed by fastening the attaching screws, the force for urging the fan-builtin heat sink against the microprocessor on the multi-chip module can be adjusted.

Furthermore, since the attaching metal fixtures for the fan-builtin heat sink are attached at the peripheral portion of the wiring board, the accommodating area for the wiring pattern on the wiring board is not decreased, and the degree of design freedom of the wiring pattern is not limited.

What is claimed is:

1. A cooling structure for a wiring board capable of carrying multiple chips, comprising:
   a heat sink having a substantially flat bottom plate;
   a cooling fan disposed in a portion of said heat sink and directed toward said bottom plate; and
   openings formed in said bottom plate of said heat sink to allow air from said cooling fan to pass through said openings,
   wherein at least a portion of a first surface of said bottom plate is disposed to be in thermal contact with at least one chip on said wiring board,
   wherein at least one of said openings is formed in a peripheral portion of said bottom plate, and
   wherein said air passing through said openings cools said at least one chip and other portions of said wiring board about said at least one chip to prevent overheating.

2. A structure according to claim 1, wherein at least one of said openings is formed at one side of said bottom plate of said heat sink.

3. A structure according to claim 2, wherein
   said bottom plate of said heat sink is rectangular, and
   said openings are formed in at least one side of said bottom plate of said heat sink at a predetermined interval.

4. A structure according to claim 1, wherein said openings comprise at least one slit.

5. A structure according to claim 1, wherein said openings comprise at least one hole.

6. A structure according to claim 1, wherein said cooling fan has a diameter which is substantially equal to a length of one side of said bottom plate of said heat sink.

7. A structure according to claim 1, further comprising another chip mounted in said other portions of said wiring board.

8. A structure according to claim 1, wherein a second surface of said bottom plate opposite said first surface includes a plurality of fins extending in a substantially perpendicular direction therefrom.

9. A cooling structure for a heat generating component, as recited by claim 1, wherein at least one of said openings intersects a side edge of said bottom plate.

10. A structure according to claim 7, wherein
    said at least one chip is a first semiconductor chip,
    wherein said another chip is a second semiconductor chip
    wherein said bottom plate has a first region opposing an upper surface of said first semiconductor chip,
    wherein said bottom plate has a second region opposing an upper surface of said second semiconductor chip, and
    wherein said openings are formed in at least said second region.

11. A structure-according to claim 10, wherein said openings formed in said second region of said bottom plate of said heat sink oppose part of said upper surface of said second semiconductor chip.

12. A structure according to claim 10, wherein said heat sink is thermally connected to said upper surface of said first semiconductor chip.

13. A structure according to claim 10, wherein
    said first semiconductor chip is a microprocessor chip, and
    said second semiconductor chip is a cache memory device chip.

14. A cooling structure for a multi-chip module, comprising:
    a heat sink having a substantially flat bottom plate;
    a cooling fan disposed in a portion of said heat sink and directed toward said bottom plate;
    openings formed in said bottom plate of said heat sink to supply air from said cooling fan to a multi-chip module;
    a multi-chip module in which a plurality of chips are mounted on a wiring board, said bottom plate being in thermal contact with a surface of at least one chip in said multi-chip module;
    a socket which is mounted on said wiring board and through which said first semiconductor chip is removably mounted;
    a press plate arranged on a lower surface of said wiring board to correspond to said socket; and
    a screw extending through said press plate, said wiring board, and said socket to threadably engage with said bottom plate of said heat sink, thereby attaching said heat sink to said multi-chip module;
    wherein at least a portion of a first surface of said bottom plate is disposed to be in thermal contact with at least one chip in said multi-chip module,
    wherein at least one of said openings is formed in a peripheral portion of said bottom plate,
    wherein said multi-chip module comprises a first semiconductor chip mounted on said wiring board and cooled by said heat sink, and a second semiconductor chip adjacent to said first semiconductor chip, and wherein said bottom plate of said heat sink has a first region opposing an upper surface of said first semiconductor chip, and a second region opposing an upper surface of said second semiconductor chip and formed with said openings.

15. A structure according to claim 7, further comprising a plurality of attaching members directly attaching said heat sink to a peripheral portion of said wiring board.

16. A cooling structure for a multi-chip module according to claim 15, wherein each of said attaching members is z-shaped and has one end fixed to said wiring board and the other end arranged above said bottom plate of said heat sink, and said structure further comprises a screw threadably engaging with said bottom plate of said heat sink through a hole in the other end of each of said attaching members, and a coiled compression spring fitted on said screw between the other end of each of said attaching members and said bottom plate of said heat sink.

17. A structure according to claim 15, wherein said wiring board is rectangular, and one end of each of said attaching members is fixed to a corresponding one of four corners of said wiring board.

* * * * *